(12) United States Patent
Acello et al.

(10) Patent No.: US 6,283,693 B1
(45) Date of Patent: Sep. 4, 2001

(54) METHOD AND APPARATUS FOR SEMICONDUCTOR CHIP HANDLING

(75) Inventors: Salvatore Acello, St. James, NY (US); Detlev Ansinn, Warrington, PA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/440,012

(22) Filed: Nov. 12, 1999

(51) Int. Cl.[7] ........................................ B32B 35/00
(52) U.S. Cl. ............... 414/403; 414/416.06; 414/416.1; 438/464; 156/344
(58) Field of Search .................... 414/403, 417; 438/464; 156/344

(56) References Cited

U.S. PATENT DOCUMENTS

| | | | |
|---|---|---|---|
| 3,720,309 | * 3/1973 | Weir | 209/73 |
| 4,138,304 | * 2/1979 | Gantley | 156/258 |
| 4,990,051 | * 2/1991 | Safabakhsh | 414/786 |
| 5,362,681 | * 11/1994 | Roberts, Jr. | 438/464 |

* cited by examiner

*Primary Examiner*—Steven A. Bratlie

(57) ABSTRACT

For stripping selected chips from a wafer of diced chips adhered, bottom surface down, to a flexible, elastic membrane, the bottom surface of the membrane is disposed against an apertured plate of a vacuum chuck for firmly holding the membrane in place with a group of the chips directly overlying push-up pins vertically movable through slots through the apertured plate. Selected pins are fired upwardly with sufficient speed to dislodge struck chips, but not non-selected adjacent chips, off the membrane and to hurl them, in free flight, upwardly against an overlying chip catching member. The stripped and caught chips are then transferred for storage or use.

17 Claims, 5 Drawing Sheets

METHOD AND APPARATUS FOR SEMICONDUCTOR CHIP HANDLING

BACKGROUND OF THE INVENTION

This invention relates to the manufacture of semiconductor devices, and particularly to a method and apparatus for removing semiconductor chips from a diced semiconductor wafer.

A known procedure for fabricating semiconductor chips is to form a plurality of chips integrally within a wafer of semiconductor material and to then dice the wafer, e.g., by sawing, into individual chips. Each chip, or group of chips, is then incorporated within a semiconductor device.

In one known procedure, a completed but still integral wafer is adhered to a thin plastic membrane tautly suspended within an annular frame for fully exposing major surfaces of the membrane. The wafer is then completely sawed through from its upper surface for dicing the wafer into individual chips while not cutting through the underlying membrane.

Prior to or after dicing the membrane, but while the chips are still in precisely ordered array, the individual chips are electrically and mechanically tested and evaluated. The test results are stored, either in a computer or by means of ink markings placed directly on each chip.

The chip assembly is next disposed within a chip transfer station where each good chip is stripped-off the supporting membrane and transferred to a work station where the chip can be, for example, mounted within a semiconductor device being assembled.

In one known chip transfer station, the chip assembly is mounted on an X-Y translating table and horizontally positioned over a pin which is movable along a vertical axis intersecting the plane of the horizontally disposed membrane. The membrane is moved by the translating table for successively disposing each chip on the membrane supported wafer to directly overlie the axis of movement of the push-up pin. When a selected chip is disposed over the push-up pin, the pin is moved upwardly into engagement with the membrane and against the bottom surface of the overlying chip. The engaged chip is raised above the plane of the membrane and against the face of a vacuum pick-up wand of a waiting transfer mechanism positioned above the membrane. The upward movement of the chip is accommodated by a local stretching of the membrane.

The vacuum wand closely overlies the chip surface, and only a relatively short upward lifting of the engaged chip is required to fully contact the raised chip against the wand face. A relatively large vacuum force is provided by the wand, and the chip, fully pressed against the wand face, adheres more firmly to the wand then to the membrane. The pick-up pin is then retracted and the wand is moved upwardly for stripping the attached chip from the membrane. The stretched membrane snaps downwardly into the original membrane plane, and the membrane-stripped chip is then transferred by the transfer mechanism to a further work station where the chip is unloaded from the wand.

The above-described chip transfer process is generally satisfactory except that, as is typically the case, increases in production speed are desired. One technique which has occurred to the inventors herein, for example, is to simultaneously transfer several rather than single chips during each transfer cycle. To this end, an array of push-up pins would be used for simultaneously raising a plurality of selected chips against a corresponding array of vacuum wands disposed closely above the wafer surface. It is desired, however, to transfer only selected chips while leaving non-selected chips firmly in place on the membrane (e.g., for possible future use). The chips are closely spaced together on the membrane and a problem is that, as any single chip is raised by a push-up pin, there is a tendency to also lift immediately adjoining chips mounted on the upwardly stretched membrane. Accordingly, if the chip transfer process comprises, as in the prior art practice, simply raising a selected chip a short distance into the field of attraction of an overlying vacuum wand, the possible slight raising of adjacent chips can likely result in the transfer or dislodgment of such adjacent chips even if non-selected.

A further problem associated with any chip handling process is that the chips tend to be quite small, closely spaced together, and relatively fragile. Thus, some "delicacy" of handling is indicated. In the afore-described prior art process, for example, each engaged chip is raised relatively slowly and only a short distance into contact with the vacuum wand while the chip is still adhered to the membrane. Only after the chip is firmly secured to and supported by the vacuum wand is the chip stripped from the membrane. Accordingly, damage of the delicate chips is avoided.

In accordance with this invention, a somewhat more "radical" approach is used for stripping chips from a membrane and conveying them to a chip transfer mechanism. An advantage, as described hereinafter, is that a higher rate of chip transfers is thus obtained.

SUMMARY OF THE INVENTION

In accordance with this invention, selected ones of a plurality of push-up pins are used for simultaneously engaging and raising a correspondingly selected plurality of chips out of the plane of a diced wafer mounted on a membrane. Each selected pin engages the bottom surface of the membrane, and the membrane portion underlying each selected chip is elastically stretched during the chip lifting process. Different techniques, either alone or in various combinations, are used for ensuring transfer only of selected chips among closely spaced together chips on the membrane.

In a preferred embodiment, each of a plurality of selected chips is simultaneously sharply impacted through the underlying membrane by a respective quite rapidly moving pin for dislodging the chip and projecting it upwardly and against an overlying vacuum wand of an array of wands. The push-up pins are disposed within a vacuum chuck having an apertured flat surface against which the membrane is fly pressed for minimizing upward movements of non-selected chips immediately adjacent to the upwardly stretched portions of the membrane. Additionally, the separation between the various wand faces and the wafer surface is sufficiently large such that, even if some lifting of non-selected chips occurs, the non-selected chips remain sufficiently far from the overlying wands to prevent stripping of such chips.

In accordance with a first embodiment of the invention, the push-up pins are disposed along a straight line and the wafer is periodically indexed for sequentially disposing groups of linearly disposed side-by-side chips over the linear group of pins. Based upon a previous testing and mapping of chips to be transferred, selected ones of the pins are simultaneously driven upwardly for impacting against respective overlying chips for simultaneously projecting the thus selected chips upwardly against respective vacuum wands of a line of wands disposed over the linear group of pins. For structural simplicity, vacuum is applied simultaneously to all the pick-up wands, and selectively in the chip transfer process is achieved solely by selective operation of the push-up pins. For greater selectivity, vacuum is applied only to those wands overlying selected chips to be transferred.

DESCRIPTION OF THE DRAWING

The drawings are schematic and drawn at varying scales.

FIGS. 5–7 illustrate a chip stripping process performed in accordance with the present invention, wherein:

FIG. 5 is a plan view of a portion of the wafer directly overlying the push-up pin assembly corresponding to a view of the apparatus as indicated by lines 5—5 in FIG. 2; and FIGS. 6 and 7 are side sectional views taken along lines 6—6 and 7—7, respectively, in FIG. 5.

DESCRIPTION OF PREFERRED EMBODIMENTS

Figure 1:
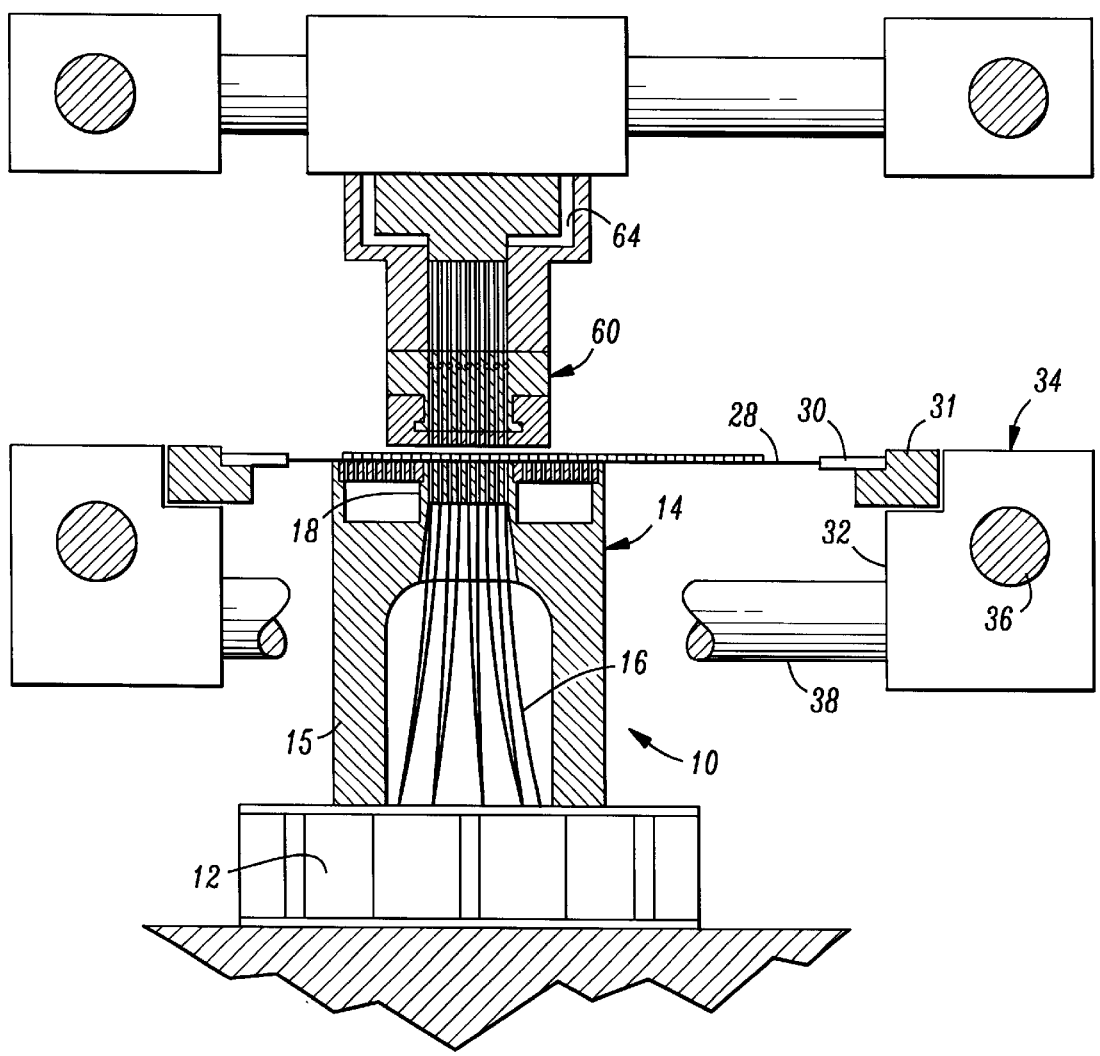
FIG. 1 is an elevational view, partly in section, of an apparatus according to the present invention.

In general, apparatus for implementing the present invention can be based upon prior existing apparatus used, as previously described, for lifting single chips from a diced wafer, by a push-up pin, into direct contact with the face of an overlying vacuum wand. Basic modifications of such apparatus comprise the use of a plurality of simultaneously acting push-up pins and significantly increasing the velocity of the push-up pins. Thus, rather than merely stretching the membrane and lifting the chips, while still attached to the membrane, against overlying vacuum wands and then stripping the chips from the membrane by movement of the wands away from the membrane, individual chips are struck directly off the membrane by respective pin impacts and hurled upwardly against an overlying wand. In the prior existing apparatus, the lifting pin travels at a speed of around 50 inches/second. As modified according to the present invention, the lifting pins travel at a chip impacting speed preferably in excess of 75 inches per second, and generally around 150 inches per second. The actual pin speed is a function of the mechanical characteristics of the chips (mass, dimensions and ruggedness) and the supporting membrane. The highest speed consistent with avoidance of damage to the impacted chips is preferred.

Somewhat surprisingly, present limitations on pin velocity are imposed by wear of the pins rather than damage of the chips. Using square silicon chips, for example, having side dimensions of 0.050 inch and a thickness of 8 mils, and circular pins of a diameter of 0.010 to 0.020 inch made from piano wire (tempered steel), it is found that for pin speeds in excess of 200 inches per second, the first problem encountered (during test production runs) is that the pins break or become misshapen even while the transferred chips are experiencing no mechanical damage. It is thus expected that even higher push-up pin speeds are possible, without damage to the chips, provided stronger push-up pins are used.

A further preferred modification of prior existing apparatus for implementing the present invention is that increased spacing is provided between each vacuum transfer wand and an underlying chip. For example, in the prior art apparatus, where the chips are lifted by the push-up pin into direct contact with the transfer wand, the transfer wand is spaced around 0.015 inch from the wafer surface. In accordance with the present invention (and solely by way of example), the transfer wands are spaced (for the same chips) around 0.020–0.050 inch from the wafer surface and the dislodged chips span the extra distance in free flight.

Significantly, the push-up pins do not, as in the prior art apparatus, lift the chips into direct contact with the vacuum wands. Avoiding such contacting reduces wear on the pins and allows far faster pin movements.

While free flight of the chips is thus desirable, the length of free flight is preferably quite small for preventing change of angular orientation of the chips. Preserving the orientation of the chips is important for further machine handling of the chips for storage or immediate use.

Rather than modifying existing pin lifting mechanisms, we have determined that commercially available mechanisms used for matrix, impact dot printing (e.g., in facsimile machines, computer printers, etc.) are quite well suited for use in the inventive process. FIG. 1 shows, for example, a commercially available array 10 of assembled together pin actuating solenoids 12 for a 9 pin dot matrix impact printer head mounted within an apparatus according to the present invention. The pin assembly 10 is available from DATA-SOUTH Computer Corporation, 4216 Stuart Andrew Blvd., Charlotte, N.C., 28217. Similar dot matrix printer heads are available from numerous manufacturers. In FIG. 1, the pin assembly 10 includes a vacuum chuck 14 (described hereinafter and shown on an enlarged scale in FIG. 2) disposed at an upper portion of a housing 15 of the pin assembly.

The various pin actuating solenoids 12 are disposed in a circular array, and each solenoid 12 drives a single elongated pin 16 along a vertical axis. The pins 16 are initially disposed around a circle having a diameter around 200 mils, but upper ends of the elongated pins extend through a pin guide 18 for changing the circular pin array to some other preferred array of pin upper ends. In the present embodiment, the upper ends of the pins are disposed in linear array.

The pins 16, in commercially available print heads of types most suitable for use according to the invention, comprise 10–20 mil diameter, 1–2 inch long wires of tempered steel and, while the wires are relatively stiff and rigid, the wires are sufficiently resilient and flexible allowing the curvature necessary for obtaining the desired pin array without stretching the pins beyond their elastic limits. The print head solenoids and pin actuating mechanisms are mechanically mounted and operated substantially as in commercial impact dot matrix printers.

One modification of the commercially obtained print heads is found desirable. The pins 16 in commercial printers typically terminate in flat, circular end faces. Herein, however, it is found best to sharpen the pin ends to a needle point, e.g., having a curved end face having a tip radius of curvature of around 5 mils. Such a relatively sharp point is desirable for shaping the stretched membrane beneath each impacted chip into a cusp. That is, the lifted and stretched membrane curves sharply away from the back surface of the chip thus effecting an easy release of the chip from the membrane while not causing damage to the chip. (With pins of a diameter greater than 10 mils, the pin ends are preferably tapered to the desired 5 mil radius.)

In commercial printers, individual characters are formed by simultaneously "firing" selected pins synchronously with relative movements between the print head and a printed medium. Known computer means are available for quite rapidly activating the pin head solenoids for precisely and rapidly forming a sequence of images, e.g., a line of print. The speed, selectivity and precision of control obtainable with known print head computers are quite adequate for the present application which, in general, proceeds far more slowly than the printing of, say, a line of type. Herein, instead of control data selecting characters to be formed, control data for selecting individual chips to be struck by individual pins is used. This data is collected by testing each chip on the wafer and storing the data in a computer for read out during the wafer stripping operation. Except that the rate and sequence of the data read out is in accordance with the operation of the inventive apparatus, known programming techniques can be used and modified as necessary. Persons of skill can readily accomplish this.

Figure 3:
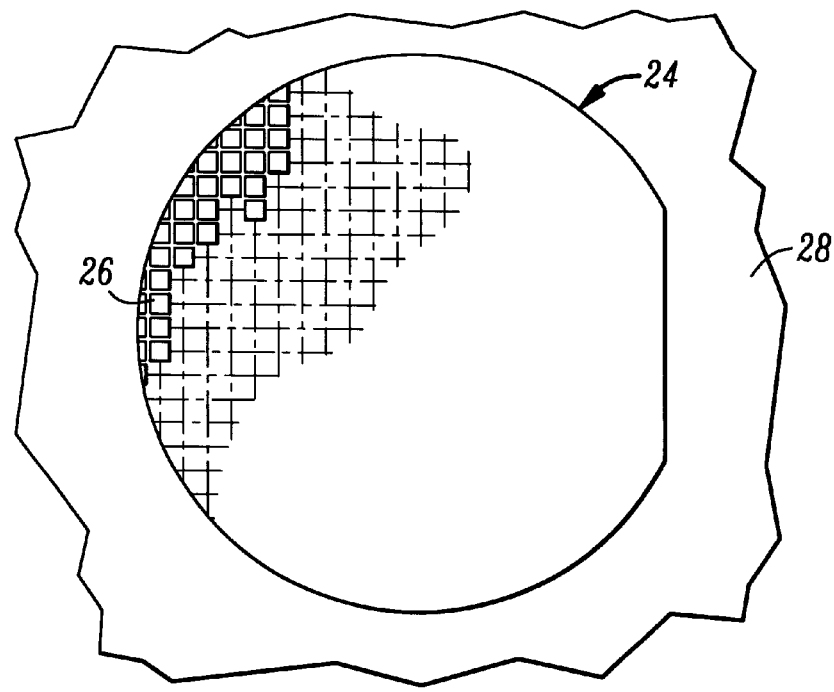
FIG. 3 is a plan view of a known workpiece comprising a diced semiconductor wafer adhered to an elastic membrane peripherally attached, as shown in FIG. 1, to a frame.

A workpiece (FIG. 3) processed by the inventive apparatus comprises, as in past practice, a diced wafer 24 of semiconductor material, e.g., silicon, including a plurality of slightly spaced apart chips 26 adhered to a plastic membrane 28 peripherally secured (as shown in FIG. 1) to an annular frame 30. All the chips 26 are disposed within the central opening of the frame 30 and can be accessed from either side of the membrane.

The membrane carrying frame 30 is mounted in horizontal orientation, as shown in FIG. 1, within a fixture 31 mounted within an opening 32 through a known X-Y translating table 34. The various chips 26 on the membrane 28 are precisely disposed in rows and columns precisely aligned with the X and Y translating axes of the table 34. (In FIG. 1, the table 34 is shown slidably mounted on guides 36 and 38 precisely perpendicular to one another and aligned with X and Y axes of the apparatus. Known computer operated stepping motors are used for precisely indexing the table along the X and Y axes.)

The previously described pin assembly 10 is mounted below the X-Y translating table 34 in fixed position. During operation of the apparatus, the table 34 is sequentially moved, or "stepped", for scanning all the chips directly over the push-up pin assembly 10. In this embodiment, nine linearly arrayed pins are used and, in each table stepping movement, respective groups of nine linearly arrayed chips are disposed over the pins. While nine chips are thus simultaneously "addressed", only selected pins are fired for stripping only selected chips from the membrane.

As mentioned, the pin assembly 10 (see, also, FIG. 2, which is an enlarged view of a portion of the apparatus shown in FIG. 1) includes a vacuum chuck 14 having an apertured top plate 44 engaged by the bottom surface of the wafer carrying membrane 28. A cavity 46 is disposed beneath the plate 44 to which a switchable vacuum source is connected. When the vacuum is turned on, the cavity 46 is evacuated and external air pressure clamps the membrane 28 firmly against the plate 44. Preferably, the spacing and pattern of the apertures 48 through the vacuum plate 44 correspond to the spacing and pattern of the chips 26 on the membrane 28. During initial set-up of the apparatus, with the vacuum in the vacuum chuck 14 off, the X-Y translating table 34 is moved for precisely aligning each chip 26 over a respective aperture 48 through the vacuum plate 44. Thereafter, as the translating table is stepped for moving the wafer 24 relative to the plate 44, the step lengths correspond to an integer multiple of the pitch of the apertures 48 so that, during each cycle of operation during which a different group of nine chips is disposed over the linear array of nine push-up pins, all chips (other than the addressed chips) are precisely aligned with respective vacuum plate apertures.

Figure 2:
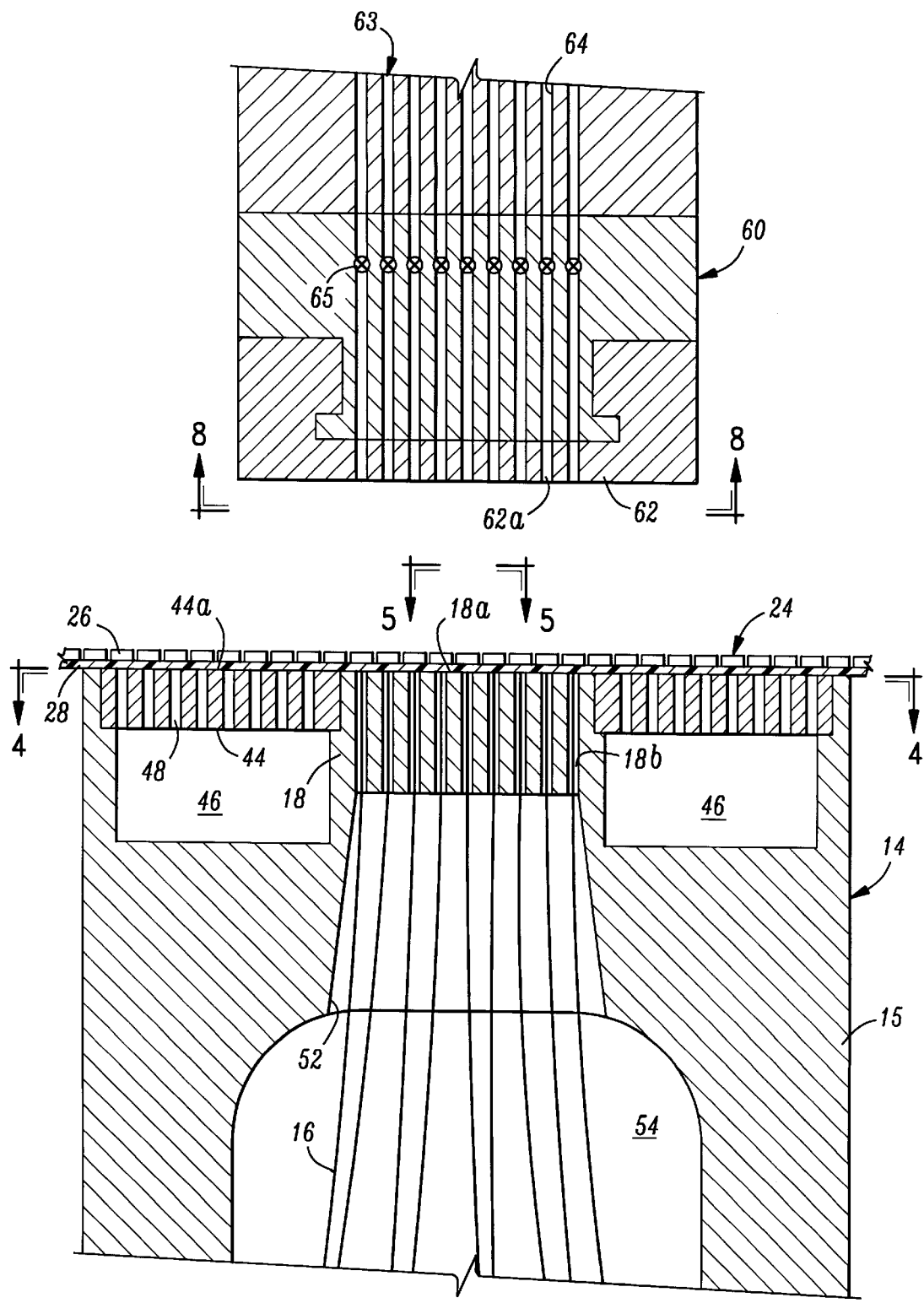
FIG. 2 shows a portion of the apparatus shown in FIG. 1 on an enlarged scale.

The nine addressed chips do not overlie vacuum plate apertures 48, and the strip of the membrane on which the nine addressed chips are adhered is not directly vacuum clamped. This is clear from FIGS. 2 and 4. FIG. 2 shows the individual push-up pins 16 passing through the pin guide 18 which is disposed centrally within and extending vertically through the vacuum cavity 46 (the cavity 46 thus being annular in shape). The pin guide 18 has an upper surface 18a lying in the plane of the upper surface 44a of the vacuum plate 44. The pin guide plate 18a includes nine linearly arrayed slots 18b communicating with first and second passageways 52 and 54 within the pin guide housing 15.

Figure 4:
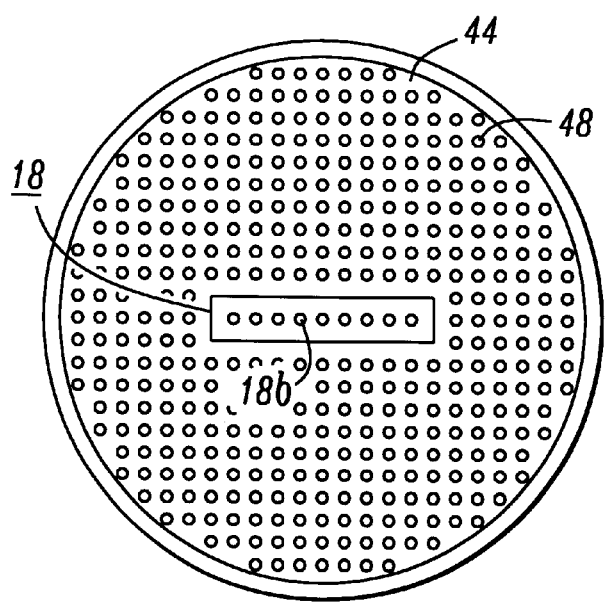
FIG. 4 is a plan view of a combined push-up pin assembly and vacuum chuck shown in FIG. 1 and viewed from and in the direction indicated by the arrows 4—4 in FIG. 2.

A plan view of the vacuum plate 44 is provided in FIG. 4. Centrally of the plate 44 is the pin guide 18 including the nine in-line pin guide slots 18b. The annular vacuum cavity 46 (FIG. 2) is sealed from the various pin guide slots 18b and passageways 52 and 54, and the interior spaces of the pin guide housing 15 (other than the vacuum cavity 46) are open to the ambient air. All of the apertures 48 in the vacuum plate 44 surrounding the pin guide 18, however, communicate with the underlying vacuum cavity 46 and vacuum is selectively applied through these apertures.

As described, the pin guide assembly 10 (FIGS. 1 and 2) in this embodiment includes nine solenoids 12 each driving a respective push-up pin 16. The circularly arranged pins merge towards one another and are linearly arrayed within respective pin guide slots 18b. The upper, free ends of the pins terminate within the slots 18b below the upper surface 18a of the pin guide 18. Activation of the solenoids 12 results in the pins 16 being rapidly accelerated and rapidly thrust above the surface 18a, e.g., by a distance of 0.010–0.025 inch (i.e., less than the aforementioned wand to wafer surface distance of around 0.0020–0.050 inch), and then immediately retracted within the pin guide. Preferably, maximum pin speed or energy is reached at the point of contact of the pins with the chips through the underlying membrane 28. A complete firing cycle of pin forward and reverse movements lasts around 0.7 msec., and typical matrix printers can fire at the rate of around 300 characters per second. As mentioned, this is faster than required in the inventive apparatus wherein the rate of firing is determined by the wand chip pick-up time, e.g., around 10 msec.

As described, the pin assembly 10 is stationery, and the translating table 34 steps the wafer in X and Y directions for successively aligning groups of chips (e.g., nine) with the pin assembly pins 16. Most simply, a chip transfer wand assembly can be used which is substantially identical to the single wand, single chip arrangement used in the prior art apparatus but including nine side-by-side vacuum wands.

FIGS. 1 and 2 show an example of such a nine vacuum wand assembly 60 including (FIG. 2) a flat plate 62 having nine linearly arrayed slots 62a connected by passageways 63 opening into a common vacuum cavity 64 (FIG. 1). When, as shown most clearly in FIG. 2, the wand assembly 60 is disposed in position for receipt of selected chips 26 from an underlying wafer 24, the wand plate 62 is spaced around 20–50 mils above the wafer upper surface. Preferably, to ensure that all the selected chips being transferred reach the plate 62, the chips are impacted sufficiently sharply by the respective push-up pins 16 to become dislodged from the membrane with a vertical speed sufficient to carry the chips to a height slightly beyond the overlying wand plate 62, e.g., to a height at least equal to 110% of height of the wand plate 62 over the wafer upper surface. While several pin speed determining parameters are present, including the amount of force needed to dislodge the chips from the membrane, the parameters are quite constant once selected. For example, all chips from thousands of different wafers for the same semiconductor device are so precisely fabricated as to be, for all mechanical purposes, substantially identical. With known *membranes of, for example, 0.002 inch thick Mylar, the wafers adhere to the membrane by static electricity without any intermediate mechanical adhesive.

Accordingly, using a trial and error process, the speed of the push-up pins 16 is readily established for any given chip. Some impacting of the moving chips against the vacuum plate 62 does occur and, for preventing damage to the chips, bouncing of the chips off the vacuum plate 62, and excessive wear of the plate 62, the bottom of the plate 62 is preferably of a relatively soft but tough material, e.g., an apertured layer of polyurethane moulded onto a steel base plate.

As described, each pick-up wand comprises simply a respective aperture 62a through the plate 62 in communication with the vacuum cavity 64. Vacuum is applied simultaneously to all the wands, and all the wands are simultaneously functional for catching and capturing any chips arriving at the respective wands (apertures 62a). Selection of which chips are stripped from the membrane and projected against directly overlying wands is controlled by selective firing of the push-up pins 16. (In FIG. 2, switches 65 are shown in each passageway 63. These switches are discussed hereinafter.)

Figure 5:
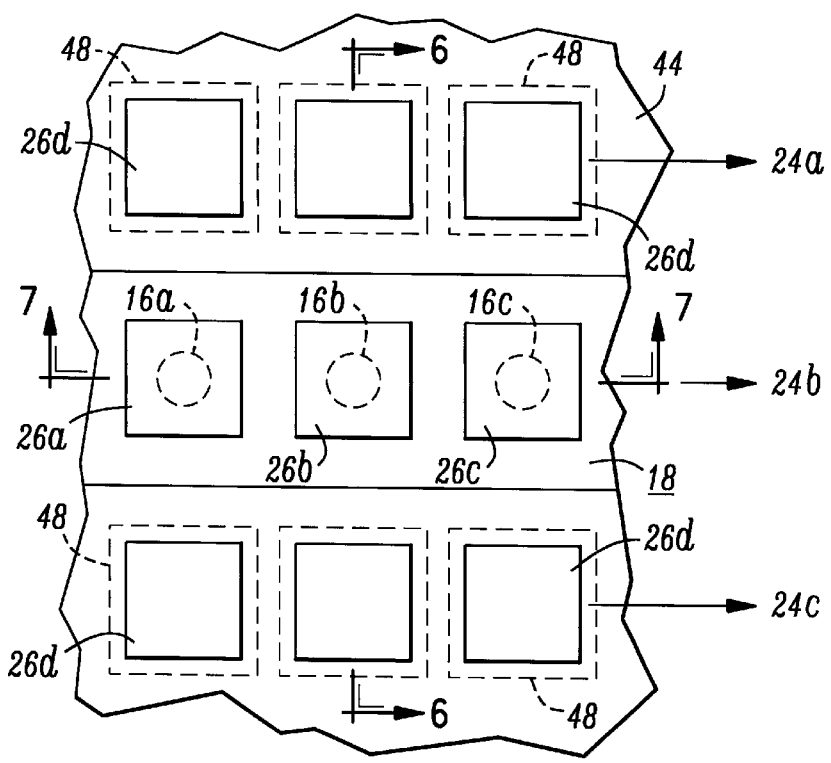
Figure 6:
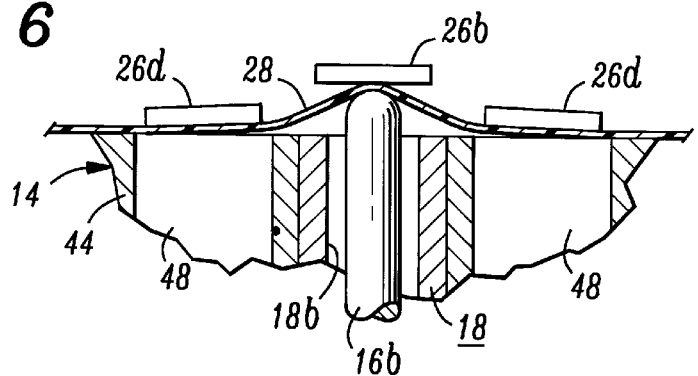
Figure 7:
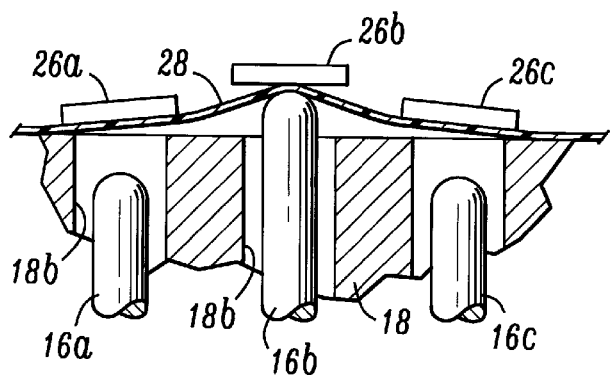

The chip transfer process is illustrated in FIGS. 5–7. Here, three side-by-side chips 26a, 26b, and 26c in a row 24b of chips are disposed (FIG. 7) over three respective push-up pins 16a, 16b, and 16c. The row 24b of addressed chips adjoins (FIG. 5) adjacent rows 24a and 24c of chips 26d disposed over (FIG. 6) apertures 48 through the top plate 44 of the vacuum chuck 14 (FIG. 2) previously described. For purposes of illustration, it is assumed that only the middle chip 26b is selected for transfer and only the middle pin 16b is fired. At the instant in the process being illustrated, the chip 26b is in the process of just being struck off the membrane 28 by the fast moving sharp pin 16b. The portion of the membrane engaged by the fired chip has been elastically and sharply stretched.

As previously noted, owing to the sharpness of the pin 16b, the membrane 28 is sharply bent, hence, as the chip 26b is lifted by the upwardly pushed and stretched membrane, the portions of the membrane on either side of the sharp pin 16b are peeled downwardly off the bottom surface of the chip. At the instant of separation of the chip from the membrane, only a relatively small area portion of the membrane is still adhered to the chip. Only a small force is now required to completely separate the chip from the membrane.

On either side (FIG. 5) of the row 24b of addressed chips, the chips 26d in the adjacent rows 24a and 24c of chips overlie apertures 48, and the portions of the membrane 28 underlying these adjacent row chips are rather firmly held in place by air pressure. As shown in FIG. 6, some small lifting of the edges of the chips 26d facing towards the addressed and raised chip 26b occurs as a result of the upward stretching of the membrane by the pin 16b.

On either side of the raised chip 26b along the row 24b of addressed chips, the non-selected chips 26a and 26c, as shown in FIG. 7, overlie non-fired pins 16a and 16c within slots 18b not under vacuum. The stretching of the portion of the membrane 28 under the selected chip 26b is not directly resisted by vacuum suction directly beneath the non-selected chips 26a and 26c. Accordingly, a greater amount of lifting of the non-selected chips 26a and 26c occurs as compared (FIG. 6) to the non-selected chips 26d directly held down by vacuum. However, while the non-selected chips 26a and 26c in the row 24b of addressed chips do not directly overlie vacuum apertures, the chips 26d on each side of the chips 26a and 26c (in the adjacent rows 24a and 24c of chips) are directly held by underlying vacuum forces. Accordingly, significant restraint on the lifting of the non-selected chips 26a and 26c is present.

As described, the likelihood of non-selected chips being stripped from or even disturbed on the membrane is extremely small. Still, for even better preventing such occurrences, each wand can be individually connected, through (FIG. 2) the aforementioned electronically controlled switch 65, to a source of vacuum. During operation, only those wands directly overlying selected chips being lifted by selectively fired push-up pins are connected to the vacuum cavity 64 through selectively opened switches. Thus, even if there is some slight lifting of non-selected chips towards the non-active overlying wands, no interaction therebetween occurs. (While the switches 65 are shown in FIG. 2, most typically they are not required and not even present for reasons of greater simplicity and reduced costs.)

The time required to translate the wand assembly 60 (FIG. 1) from a fixed position over the pin assembly 10 to a chip unloading station consumes a significant portion of each transfer cycle. To make better use of this translation time, it is desirable to increase the number of chips captured by and transferred by the wand assembly. One approach is to increase both the number of vacuum wands and push-up pins. The more push-up pins, however, the greater is the complexity and cost of the apparatus.

A somewhat more simple solution involves increasing the capacity of the chip transfer assembly while not increasing the number of push-up pins. Thus, by disposing the vacuum wands in a, e.g., nine by nine matrix of wands, rather than the single row of wands previously described, up to eighty-one chips can be transferred in the same wand assembly transit time used to transfer nine selected chips according to the embodiment illustrated in FIGS. 1 and 2.

Figure 8:
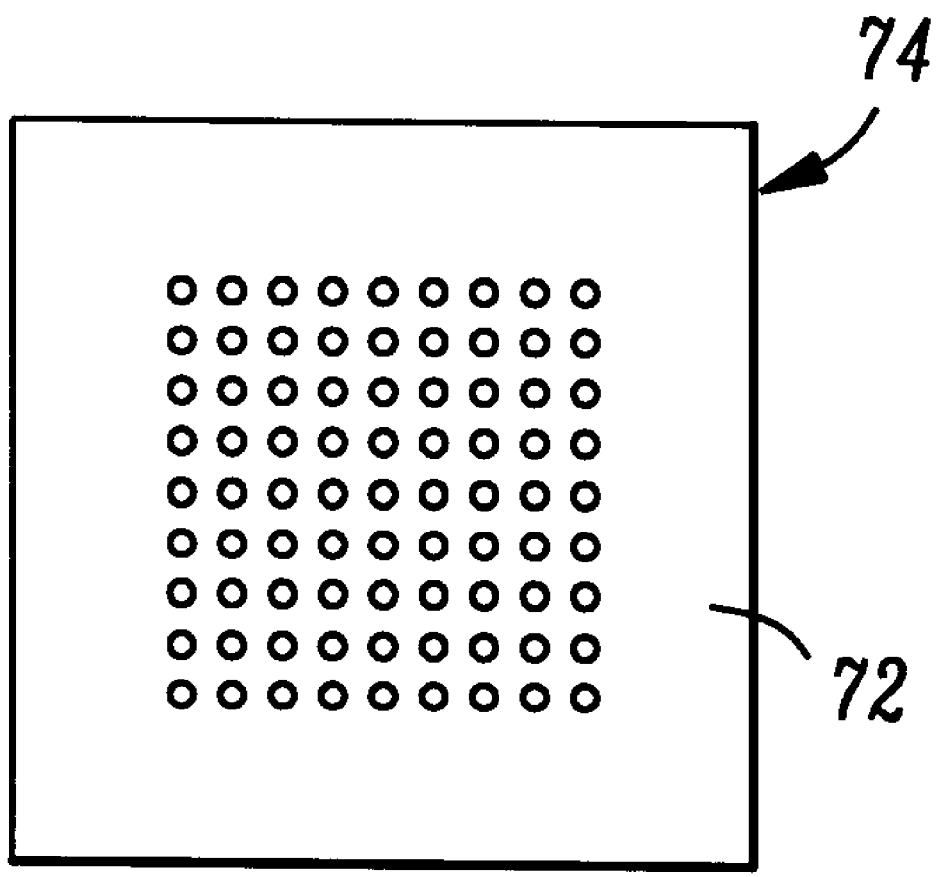
FIG. 8 is a bottom view of a chip transfer mechanism different from the one shown in FIG. 2 and viewed, when in use on the apparatus, from the position indicated by the arrows 8—8 in FIG. 2.

The bottom, pick-up plate 72 of such a nine by nine wand assembly 74 is shown in FIG. 8. How vacuum is applied to each wand is a matter of choice. Optimally, each of the eighty-one wands is individually switchable to the vacuum source, but this involves a high degree of complexity. A preferred compromise is to apply vacuum, though nine switches, to each row of wands functioning, at any time, for receiving chips from an addressed row of chips.

In operation, the nine by nine wand matrix is positioned to align one row of nine wands over the row of push-up pins. Vacuum is applied to the one row of aligned wands, and the selected chips in a first group of nine side-by-side chips aligned with the push-up pins are transferred to the overlying row of wands. Then, simultaneously with the indexing of the X-Y table 34 for positioning a second group of chips over the push-up pins, the wand matrix is indexed to align a second row of nine wands with the push-up pins.

The time savings result from the fact that the time required for the short distance indexings of the X-Y table and the wand assembly, as well as the time required for the performance of each chip stripping and capturing process, are far shorter than the time required to move the wand assembly from the chip loading position to the chip unloading station. Thus, each complete transfer cycle, involving the steps of transferring up to eighty-one selected chips to the wand assembly, translating the loaded wand assembly to a chip unloading station, unloading the chips into a chip storage mechanism, and then returning the wand assembly to overlie the pin assembly 10, can be only slightly longer, e.g., by a factor of 1.5, than the time required according to the prior art apparatus for stripping and transferring but a single chip.

A summary of the operation of the illustrative apparatus is now provided.

A workpiece (FIG. 3) comprising a diced wafer adhered to a membrane is mounted on the apparatus (FIG. 1) and, in an initial set-up, the workpiece is positioned such that straight and uniformly spaced rows and columns of the chips are aligned with the X and Y axes of the translating table 34. The membrane overlies the vacuum chuck 14 with each chip directly overlying an aperture 48 (FIG. 2) through an upper plate 44 of the chuck. During movements of the table for scanning the wafer over the pin assembly 10, the vacuum chuck is not under vacuum and the membrane 28 slides easily over the chuck plate 44. After each indexing step of the translating table for repositioning the wafer relative to the pin assembly, vacuum is applied to the chuck 14 for firmly pressing the membrane against the vacuum plate 44 with, as in the initial set-up, each chip being disposed directly over an aperture 48 through the plate 44.

The apparatus is operated under computer control and, in accordance with prior art practice, previously acquired test data is provided to the computer whereby, as successive groups of nine chips are aligned with ("addressed" by) the pin assembly 10, only selected pins 16 are fired for stripping only selected chips from each addressed group of chips.

During the chip stripping process, the row of addressed chips is overlaid with a row of chip capturing wands of a wand assembly, e.g., 74 shown in FIG. 8. Preferably, all the wands in the row are simultaneously functional and all (and only the) chips flung upwardly by the fired pins 16 are captured. Alternatively, and using the same stored data used for selectively firing the solenoids, only selected wands are made functional for better avoiding accidental capture of non-selected chips by the wand assembly.

Using a nine by nine wand assembly 74, nine successive rows of the assembly are indexed into alignment with the pin assembly 10 during nine successive indexings of the translating table. Nine successive chip stripping processes are performed for selectively stripping up to eighty-one chips from the wafer and capturing the stripped chips on the wand assembly.

During each chip stripping process, vacuum is applied to the one row of wands aligned with the addressed chips. Preferably, vacuum is not applied to the rows of wands not yet used. Conversely, as each row of wands is loaded with captured chips, vacuum is maintained at the loaded rows for retaining the chips in place.

Once all nine rows of wands of the wand assembly have been loaded with selectively stripped chips, the wand assembly is translated to a chip unloading station. The chips are unloaded as rapidly as possible while; preferably, retaining the orientation of the chips. One unloading technique is to step the wand assembly over a row of nine chip receiving chutes into which chips are received for forming nine stacks of precisely oriented chips. As each row of wands is indexed over the row of chutes, vacuum to the then chute-aligned wand row is turned-off for allowing the chips in the aligned row to drop into the underlying chips.

The unloaded and stacked chips are then further handled and used in accordance with known procedures.

What is claimed is:

1. A method of handling a plurality of semiconductor chips each having a bottom surface adhered to a top surface of a flexible membrane comprising the step of striking the undersurface of the membrane directly beneath a selected chip with such force for separating the chip from the membrane at a point in space and projecting the chip along a path to a chip catcher spaced from said point.

2. A method according to claim 1 including the step of restraining portions of the membrane surrounding said selected chip from movements in the direction of movement of said chip.

3. A method according to claim 2 including the step of striking said membrane with a pin having a rounded striking end having a radius of curvature of around 0.005 inch.

4. A method according to claim 3 including, prior to and during said striking step, positioning a vacuum wand directly in the path of the struck chip.

5. A method according to claim 4 wherein said positioning step comprises disposing said wand, prior to said striking step, directly over said chip and at a distance therefrom of around 90% of the height reachable by said chip resulting from said striking step.

6. A method according to claim 4 wherein said selected chip is one of a plurality of non-selected chips adhered to the membrane in side-by-side relation with the selected chip, and including the step of disposing portions of the membrane beneath non-selected chips directly over first apertures under vacuum while disposing the portion of the membrane beneath the selected chip over a second aperture not under vacuum.

7. A method according to claim 6 wherein said striking step is performed by driving said pin upwardly through said second aperture.

8. An apparatus for transferring chips each having a bottom surface adhered to an upper surface of an elastic membrane, the apparatus comprising a vacuum chuck including a first plate having first apertures therethrough opening onto a first surface of said first plate for pressing said membrane against said first surface when vacuum is applied to said first apertures, and a push-up pin assembly including a second plate having a plurality of second apertures therethrough opening onto a second surface of said second plate continuous with said first surface and directly underlying chips adhered to said membrane, said assembly including a plurality of push-up pins having free ends extending into respective second apertures, and individually actuated pin drivers for simultaneously driving selected said pins upwardly through the upper surface of said plate for simultaneously dislodging from the membrane those chips overlying said selected pins.

9. An apparatus according to claim 8 wherein said first apertures are in surrounding relation with said second apertures which are open to the ambient atmosphere.

10. An apparatus according to claim 9 wherein said pin drivers comprise electrically operated solenoids, said pins extending from respective solenoids disposed in circular array, and said pins being in circular array adjacent to said solenoids and merging into linear array at said second apertures.

11. An apparatus according to claim 10 wherein said first apertures are arrayed in linear rows and columns and at spacings equal to the spacings between linearly arrayed rows and columns of chips on said membrane.

12. An apparatus according to claim 10 wherein each of said pins is of circular cross-section and terminates in a rounded end.

13. An apparatus according to claim 12 wherein said pins are of tempered steel and have a diameter between 0.010 and 0.020 inch.

14. An apparatus according to claim 10 wherein said solenoids drive said pins at a speed in excess of 75 inches per second.

15. An apparatus according to claim 8 including a chip transferring assembly including a plurality of linearly arrayed vacuum wands each effective for capturing a chip dislodged from said membrane and projected into contact with said each wand.

16. An apparatus according to claim 15 wherein said wands are disposed in linear rows and columns, with the spacings of wands along each row being equal to the spacings between said push-up pins, the number of wands in each row being equal to the number of linearly arrayed pins, and the number of rows being greater than one.

17. An apparatus according to claim 16 wherein the number of rows of wands equals the number of wands in each row.

* * * * *